United States Patent
Yoon et al.

(10) Patent No.: US 8,439,513 B2
(45) Date of Patent: May 14, 2013

(54) LIGHT EMITTING DIODE MODULE AND BACK LIGHT ASSEMBLY

(75) Inventors: Jisu Yoon, Paju-si (KR); Kyeongkun Jang, Incheon (KR); Jaeho Lee, Daegu (KR); Kiseong Kim, Paju-si (KR); Minsu Cho, Paju-si (KR); Lan Jin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 345 days.

(21) Appl. No.: 12/461,772

(22) Filed: Aug. 24, 2009

(65) Prior Publication Data
US 2010/0165601 A1    Jul. 1, 2010

(30) Foreign Application Priority Data
Dec. 30, 2008    (KR) .................. 10-2008-0137237

(51) Int. Cl.
G09F 13/04    (2006.01)

(52) U.S. Cl.
USPC .................. 362/97.1; 362/97.3; 362/249.02

(58) Field of Classification Search ............. 362/97.1, 362/97.3, 311.02, 249.02
See application file for complete search history.

(56) References Cited

U.S. PATENT DOCUMENTS

| | | | |
|---|---|---|---|
| 6,930,332 B2* | 8/2005 | Hashimoto et al. | 257/98 |
| 2003/0189830 A1* | 10/2003 | Sugimoto et al. | 362/294 |
| 2005/0073846 A1* | 4/2005 | Takine | 362/296 |
| 2006/0001361 A1* | 1/2006 | Imai et al. | 313/498 |
| 2006/0164858 A1* | 7/2006 | Park et al. | 362/561 |
| 2006/0215075 A1* | 9/2006 | Huang et al. | 349/67 |
| 2008/0002403 A1* | 1/2008 | Kim | 362/240 |
| 2008/0111944 A1* | 5/2008 | Sakai | 349/61 |
| 2008/0303157 A1* | 12/2008 | Cheng et al. | 257/758 |

FOREIGN PATENT DOCUMENTS

| | | | |
|---|---|---|---|
| CN | 1466782 | | 1/2004 |
| CN | 2878909 | | 3/2007 |
| CN | 101097344 | | 1/2008 |
| KR | 2007-0011470 | * | 8/2008 |

OTHER PUBLICATIONS

English Machine Translation of KR 10-2007-0011470.*

* cited by examiner

*Primary Examiner* — Evan Dzierzynski
(74) *Attorney, Agent, or Firm* — Mckenna Long & Aldridge, LLP

(57) ABSTRACT

The present application presents a light emitting diode module comprising a substrate including a first insulating layer, a second insulating layer, and a metal layer between the first and the second insulating layers; a groove formed at the first insulating layer for exposing the metal layer; and a light emitting element disposed at the groove, and including an LED chip and body part surrounding the LED chip, wherein the LED chip contacts the metal layer for radiating heat.

3 Claims, 10 Drawing Sheets

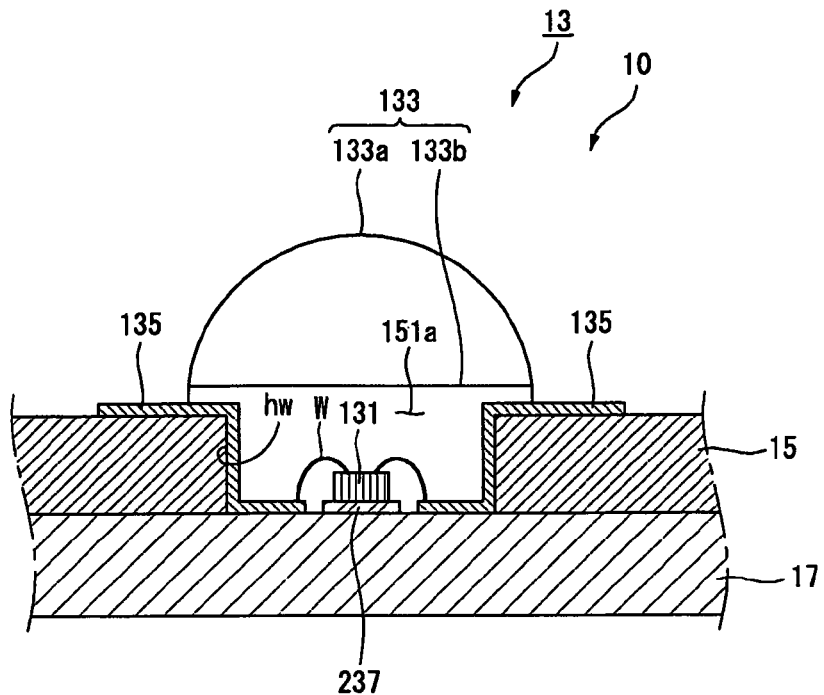
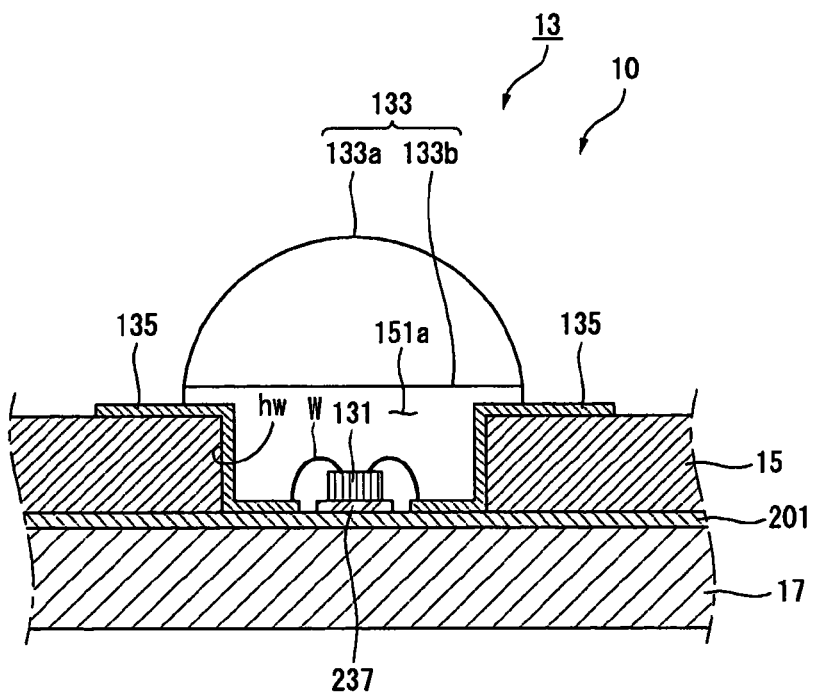

LIGHT EMITTING DIODE MODULE AND BACK LIGHT ASSEMBLY

This application claims the benefit of Korea Patent Application No. 10-2008-137237 filed on Dec. 30, 2008, which is incorporated herein by reference for all purposes as if fully set forth herein.

BACKGROUND OF THE INVENTION

1. Field of the Invention

This application relates to a light emitting diode (hereinafter called "LED") module and a backlight assembly having the LED module.

2. Discussion of the Related Art

Among various display device representing image and/or video data, the liquid crystal display device (hereinafter called "LCD device") becomes a representative display device because it has a lighter weight feature and a thin flat panel device feature due to the semiconductor technology. As the LED device is applied with inactive display panel which cannot emit light by itself, it is required to be equipped with backlight assembly for supplying light from the rear side of the display panel.

For the light source of backlight unit, the fluorescent lamp such as Cold Cathode Fluorescent Lamp (CCFL) has been used. Recently, however, the light emitting diode (hereinafter "LED") starts to be applied because it has many merits in consumption electric power, weight, luminescence and so on. The LED backlight assembly can be made of single LED or a module comprising a plurality of LEDs.

A light-emitting diode, usually called an LED, is a semiconductor diode that emits incoherent narrow-spectrum light when electrically biased in the forward direction of the p-n junction, as in the common LED circuit. This effect is a form of electroluminescence. Like a normal diode, the LED consists of a chip of semiconducting material impregnated, or doped, with impurities to create a p-n junction. As in other diodes, current flows easily from the p-side, or anode, to the n-side, or cathode, but not in the reverse direction. Charge-carriers—electrons and holes—flow into the junction from electrodes with different voltages. When an electron meets a hole, it falls into a lower energy level, and releases energy in the form of a photon.

The wavelength of the light emitted, and therefore its color, depends on the band gap energy of the materials forming the p-n junction. The color of the emitted light depends on the composition and condition of the semiconducting material used, and can be infrared, visible, or ultraviolet. Therefore, using the band gap energy of the materials forming the p-n junction, it is possible to get various light colors, for example, blue, green or white.

As the LED has simple structure and low cost for mass-production, LED is applied to various industrial fields. Furthermore, as it is possible to form a thin film structure, it is used for backlight of the inactive display panels.

However, LED makes a lot of heat energy so that the heat energy can make bad effects, for example, shortening the life-time of LED or defects on LED itself.

SUMMARY OF THE INVENTION

The present application is suggested to solve the drawbacks of the related arts. Thus, the purpose of the present application is to suggest an LED module and a backlight assembly thereof in which the heat emitting problem of the LED is remarkably improved.

To achieve the purpose of the present application, an LED module according to one embodiment of the present application comprises: a substrate including a first insulating layer, a second insulating layer, and a metal layer between the first and the second insulating layers; a groove formed at the first insulating layer for exposing the metal layer; and a light emitting element disposed at the groove, and including an LED chip and body part surrounding the LED chip, wherein the LED chip contacts the metal layer for radiating heat.

The LED module further comprises a lead part formed on the metal layer exposed by the groove, wherein the LED chip is disposed on the lead part.

The LED module still further comprises a heat radiating plate disposed between the LED chip and the metal layer.

Another embodiment of the present application suggests a backlight assembly comprising: a light emitting diode module having a light emitting element; a reflective plate having hole corresponding to the light emitting element; and a cover bottom enclosing the reflective plate and the light emitting diode module, wherein the light emitting diode module comprises: a substrate including a first insulating layer, a second insulating layer, and a metal layer between the first and the second insulating layers; a groove formed at the first insulating layer for exposing the metal layer; and the light emitting element disposed at the groove, wherein the light emitting element including an LED chip and body part surrounding the LED chip.

Still another embodiment of the present application provides a backlight assembly comprising: a cover bottom having a light emitting element; a driving board disposed at one side of the cover bottom for driving the light emitting element; and a reflective plate having a hole corresponding to the light emitting element, and mounted on the cover bottom.

The backlight assembly further comprises an insulating layer exposing some portion of the cover bottom, and disposed on the cover bottom, wherein the light emitting element comprises: a buffer disposed on the exposed portions of the cover bottom; an LED chip disposed on the buffer; and a lead part electrically connected to the LED chip.

The backlight assembly still further comprises a pattern disposed on the insulating layer, and electrically connected to the lead part.

The backlight assembly yet further comprises a connect module connecting the light emitting element electrically, wherein the connect module comprises: a substrate; a hole disposed at position corresponding to the light emitting element on the substrate; a terminal disposed near the hole on the substrate, and electrically connected to the lead part of the light emitting element; and a pattern printed on the substrate, and electrically connected to the terminal.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 6a to 6d illustrate other examples of the second embodiment showing in FIGS. 5a and 5b.

DETAILED DESCRIPTION OF THE ILLUSTRATED EMBODIMENTS

Advantages and features of the present invention and a method of achieving the advantages and the features will be apparent by referring to embodiments described below in detail in connection with the accompanying drawings.

Hereinafter, referring to drawings, some preferred embodiments of the present application are explained in detail. However, the present application is not restricted by these embodiments but can be applied to various changes or modifications without changing the technical spirit.

Figure 1:
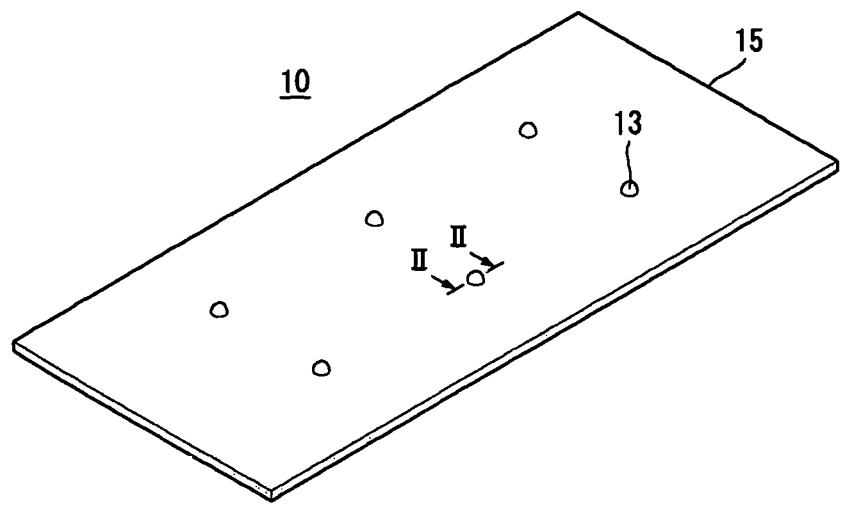
FIG. 1 illustrates a light emitting diode according to the first embodiment of the present application.
Figure 2:
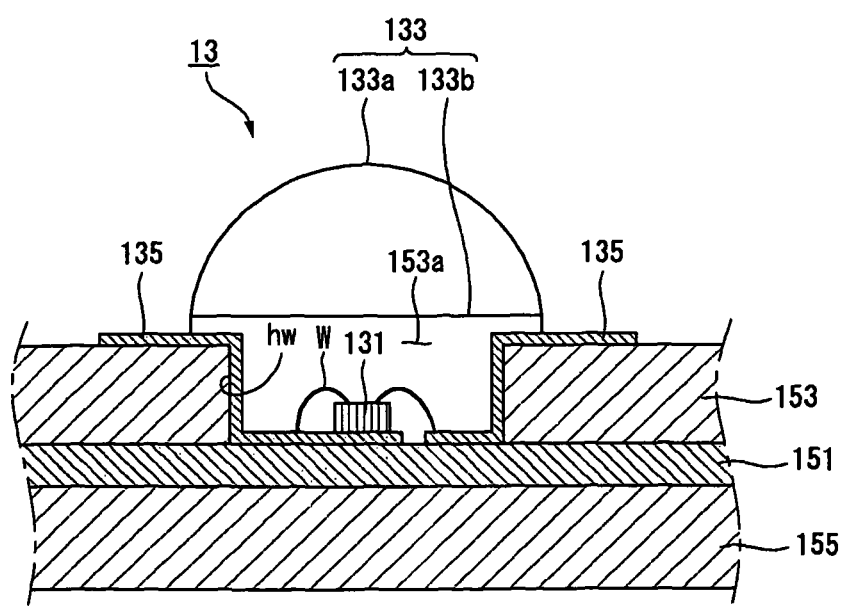
FIG. 2 is the cross-sectional diagram along the cutting line II-II of FIG. 1.

FIG. 1 illustrates an LED module according to the first embodiment of the present application and FIG. 2 is a cross-sectional view cutting along with the line II-II of FIG. 1.

Referring to FIGS. 1 and 2, the LED module 10 comprises a plurality of light emitting element 13 and a substrate 15 on which the light emitting elements 13 are formed.

The light emitting elements 13 are connected each other by a circuit pattern printed on the substrate 15, and they emit lights according to the driving signal supplied from circuit elements not shown in the drawings. In the drawings, light emitting elements 13 are arrayed in 2 rows and 3 columns. Each light emitting element 13 is shown as comprising one LED emitting white light. However, the light emitting element 13 may comprise a set of LEDs, in which each LED emits red light, green light or blue light.

In the first embodiment, the substrate 15 may be a metal printed circuit board (or "metal PCB") comprising a base plate made of metal having a good thermal conductivity such as aluminum (Al). The metal PCB includes a plurality of insulative layers made of non-conductivity material such as epoxy and a metal base layer between the insulative layers.

As shown in FIG. 2, the light emitting element 13 includes a LED 131, a molding part 133, and lead part 135. The LED chip 131 emits light according to a driving signal.

The molding part 133 encloses the LED chip 131 to protect the LED chip 131 from being damaged. The molding part 133 includes body 133b for protecting the LED chip 131 and a lens 133a for concentrating the light emitted from the LED chip 131. Hereinafter, even though it will be explained as the molding part 133 includes lens 133a, the lens 133a can be omitted from the molding part 133a or it can be integrated with the body 133b, alternatively.

The lead part 135 is connected to the anode and cathode of the LED chip 131. One end of the lead 135 is extended out of the molding part 133 so that it can be electrically connected to the pads of the circuit pattern printed on the substrate 15.

The LED chip 131 is formed on the lead part 135. The lead part 135 is made of material having electrical conductivity like metals and high thermal conductivity. Therefore, the heat generated from the LED chip 131 can be radiated via the lead part 135 to prevent the LED chip 131 from being degraded or damaged.

The lead part 135 and the LED chip 131 can be connected through wire (w). Therefore, through the lead part 135, the driving signal can be transmitted to the LED chip 131.

The substrate 15 includes a first insulating layer 153 having a groove 153a, a second insulating layer 155, and a metal layer 151 between the first insulating layer 153 and the second insulating layer 155. The groove 153a is formed by removing some portions of the first insulating layer 153 to expose some portions of the metal layer 151 sandwiched between the first insulating layer 153 and the second insulating layer 155.

The lead part 135 is formed on the wall (hw) of the groove 153a and the portions of the metal layer 151 exposed through the groove 153a so that the lead part 135 has a crank shape covering the surface of the first insulating layer 153, wall (hw) of the groove 153a and the exposed surface of the metal layer 151. As the light emitting diode chip 131 is disposed on the lead part 135 formed on the metal layer 151 exposed through the groove 153a, the light emitting element 13 is actually mounted on the groove 153a.

As seen in the first embodiment, as the LED chip 131 is contacted to the metal layer 151 of the substrate 15 through the lead part 135, the heat generated when the LED chip 131 is operating can be guided to outside of the LED chip 131 effectively through the metal layer 151.

Figure 3:
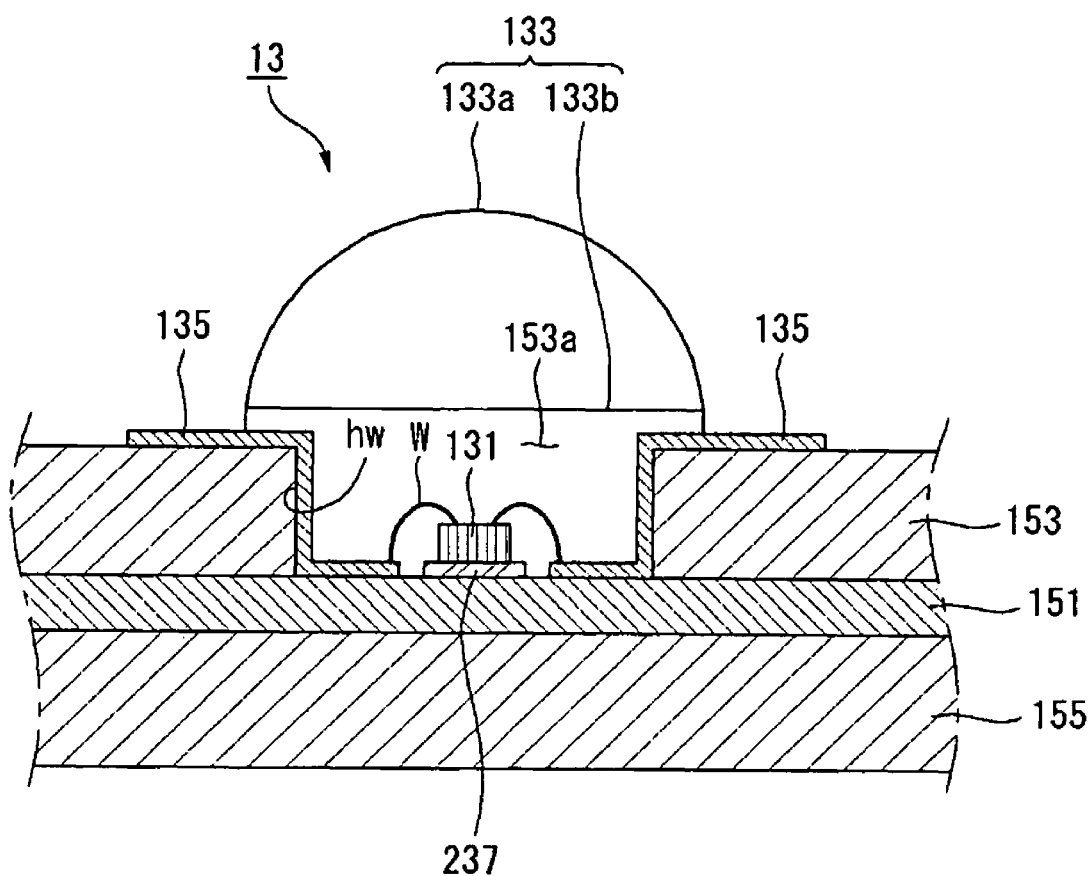
FIG. 3 illustrates that a heat radiating plate is further comprised between the LED chip and the metal layer of the FIG. 2.

FIG. 3 illustrates that a heat radiating plate 237 is further comprised between the LED chip 131 and the metal layer 151. Comparing with the FIG. 2, the LED chip 131 is not formed on the lead part 135 but on the heat radiating plate 237. Disposing between the LED chip 131 and the metal layer 151, the heat radiating plate 237 enlarges the contact area between the LED chip 131 and the metal layer 151. Therefore, it is possible to transmit the heat from the LED chip 131 to the metal layer 151 more effectively.

Figure 4:
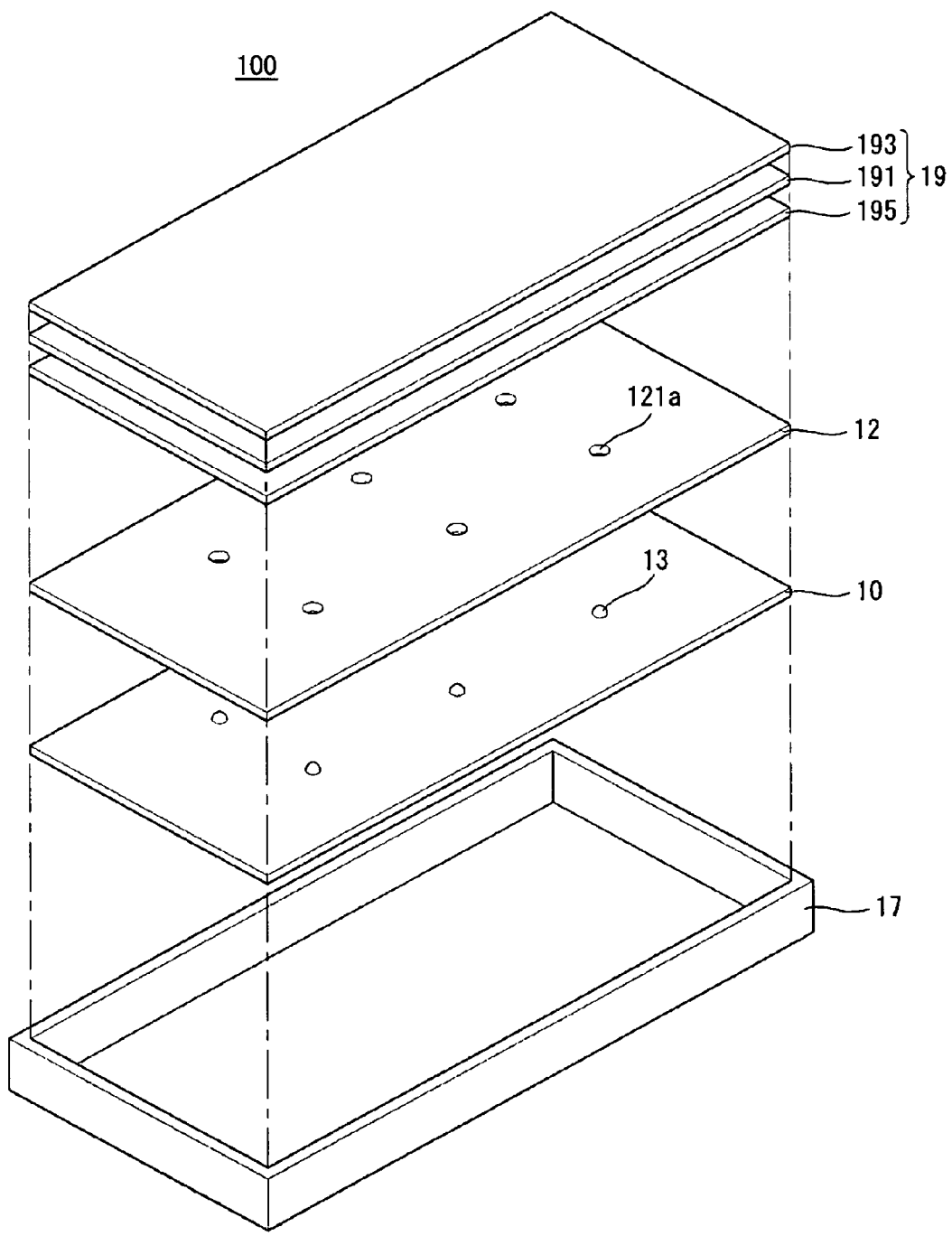
FIG. 4 illustrates a backlight assembly comprising the LED module according to the first embodiment shown in FIG. 1.

FIG. 4 illustrates a backlight assembly 100 comprising the LED module 10 shown in the FIG. 1. As shown in FIG. 4, a backlight assembly 100 according to the first embodiment of the present application comprises the LED module 10, an optical film 19, a reflective plate 12 and a cover bottom 17.

The cover bottom 17 encloses the LED module 10 and the reflective plate 12. It can also hold the optical film 19 combining with the upper cover (not shown). For ensuring good heat radiating property, the cover bottom 17 may be made of metal such as aluminum.

The reflective plate 12 may includes a plurality of LED hole 121a so that each light emitting element 13 is corresponding to each LED hole 121a. The reflective plate 12 may be disposed inside of the cover bottom 17 enclosing the LED module 10 so that it can re-reflect the light reflected by the optical film 19. On other words, the light emitted from the LED module 12 can be reflected by the optical film 19 to downward. The reflective plate 12 reflects the reflected light to the upward direction, again.

The optical film 19 may include a plurality of film for improving the properties of the light emitting from the light emitting element 13. For example, the optical film 13 may comprise a diffusion film 191, a diffusion sheet 193, an optical sheet 195 and so on. If required, some of them cannot be included.

For the case of the optical sheet 195, it may be a sheet having a prism pattern, lenticular lens pattern or micro lens pattern. Furthermore, the optical sheet 195 can include an additional element such as bead for enhancing the optical effect of the light.

Figure 5A:
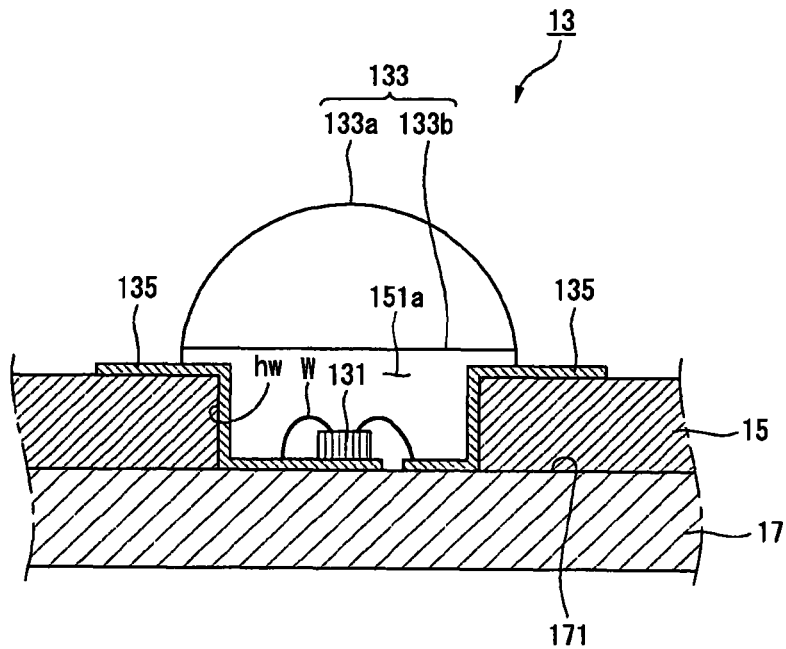
FIGS. 5a and 5b illustrates the cross-sectional views of the LED module according to the second embodiment of the present application.
Figure 5B:
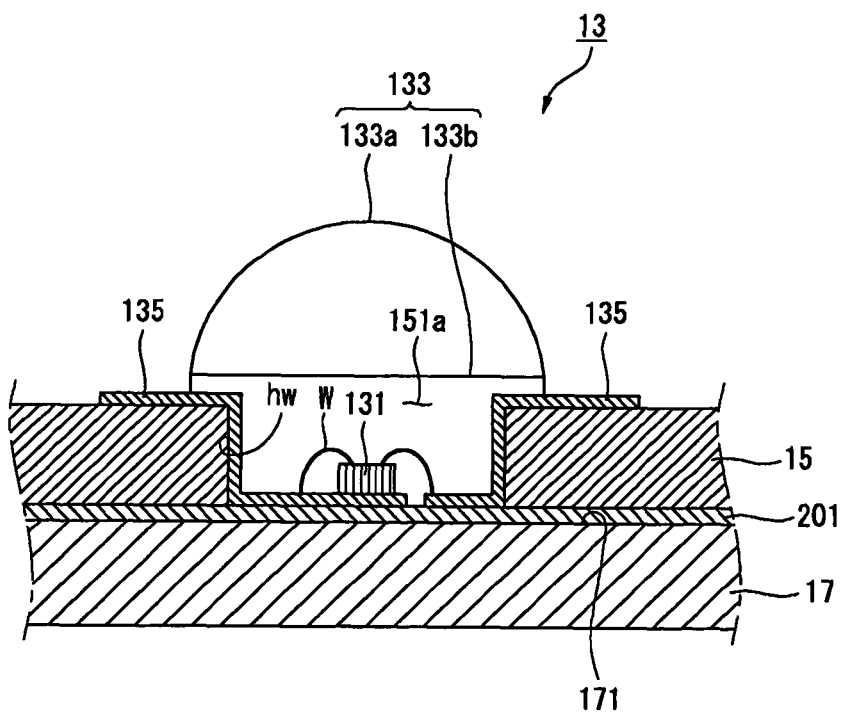

FIGS. 5a and 5b are cross-sectional views illustrating an LED module according to the second embodiment of the present application. Comparing with FIGS. 1 and 2, for the same elements, the same numerical references will be used and detailed explanation may not be mentioned.

As shown in FIGS. 5a and 5b, the LED module 10 is disposed as the rear side of the LED module 10 is directly contacting with the upper surface 171 of the cover bottom 17. Here, the substrate 15 of the LED module 10 may be made of an epoxy substrate used for general purpose printed circuit board such as FR4 or CEM3.

The substrate 15 has a plurality of mounting hole 151a penetrating the substrate 15. Through the mounting hole 151a, some portions of upper surface 171 of the cover bottom 17 are exposed. In each mounting hole 151a, an light emitting element 13 comprising LED chip 131, molding part 133 and lead part 135 is disposed.

The lead part 135 is formed on the wall (hw) of the mounting hole 151a and the some for upper surface 171 of the cover bottom 17 which is exposed by the mounting hole 151a so that the lead part 135 has a crank shape covering the surface of the substrate 15, wall (hw) of the mounting hole 151a and the exposed surface of the cover bottom 17. On the lead part 135, an LED chip 131 is disposed. Therefore, the LED chip 131 can contacted with the cover bottom 17 via the lead part 135.

Due to this structure, the heat from the LED chip 131 can be transmitted to the cover bottom 17 via the lead part 135 so that it is possible the heat of the light emitting element 13 (especially LED chip 131) can be cooled down.

FIG. 5b illustrates that a heat radiating sheet 201 is further comprised between the substrate 15 and the cover bottom 17. Disposing between the substrate 15 and the cover bottom 17, the heat radiating sheet 201 enhances the thermal conductivity between the light emitting element 13 (especially LED chip 131) and the cover bottom 17. In addition, the contact surface between the substrate 15 and the cover bottom 17 can be enlarged so that the heat from the light emitting element 13 can be guided to outside more effectively.

Comparing with FIGS. 5a and 5b, FIGS. 6a to 6b illustrate that the LED chip 131 is dispoded on a heat radiating plate 237 instead of the lead part 135. The heat radiating plate 237 is sandwiched between the LED chip 131 and the cover bottom 17 so that it is possible to effectively radiate the heat from the LED chip 131 to the cover bottom 17 by enhancing the thermal conductivity. Furthermore, disposing between the substrate 15 and the cover bottom 17, the heat radiating sheet 201 enhances the thermal conductivity between the light emitting element 13 and the cover bottom 17. In addition, the contact surface between the substrate 15 and the cover bottom 17 can be enlarged so that the heat from the light emitting element 13 can be guided to outside more effectively.

Figure 6C:
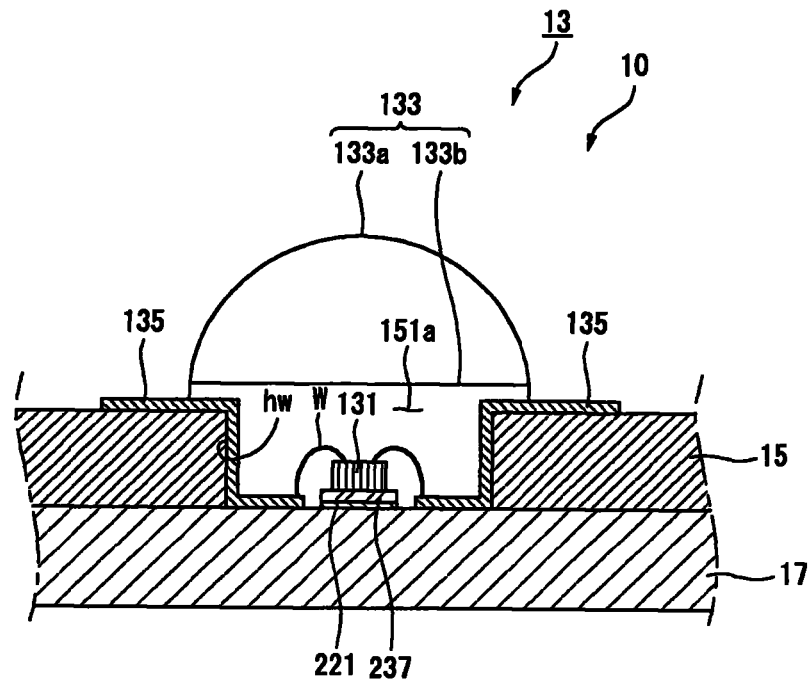

As shown in FIG. 6c, the LED chip 131 may be fixed on the cover bottom 17 using a solder 221. The solder 221 may be made of a material having excellent thermal conductivity such as tin or lead so that it is possible to transmit heat from the LED chip 131 to the cover bottom 17 quickly. Furthermore, it is possible to fix the LED chip 131 on the cover bottom 17 so that the manufacturing process can be improved.

Figure 6D:
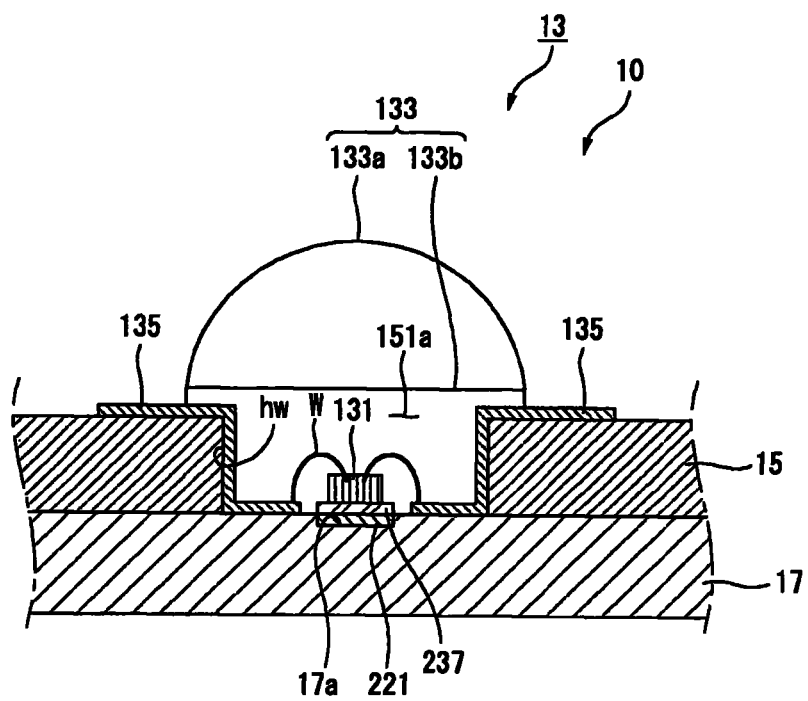

In the FIG. 6d, the cover bottom 17 may further include soldering groove 17a. The soldering groove 17a is formed where the LED chip 131 will be disposed. In the soldering groove 17a, solder 221 is disposed so that the LED chip 131 can be fixed on the cover bottom 17 by the solder 221. As the solder 221 is positioned at the soldering groove 17a, the substrate 15 of the LED module 10 cannot be feeling off from the cover bottom 17. The heat from the LED chip 131 can be transmitted to the cover bottom 17 quickly so that the light emitting element 13 can be cooled down effectively.

Figure 7:
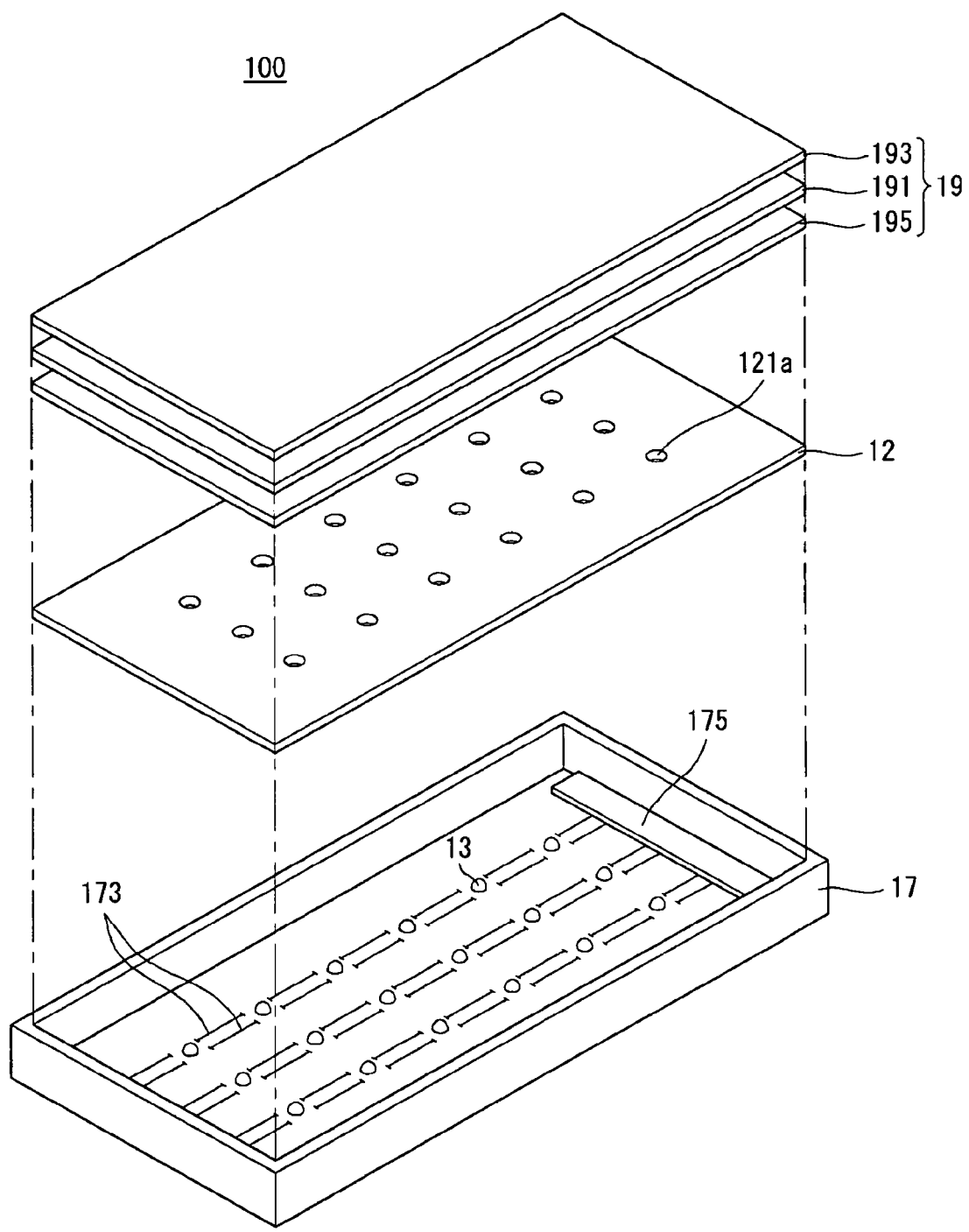
FIG. 7 illustrates a backlight assembly comprising the LED module according to the second embodiment.
Figure 8:
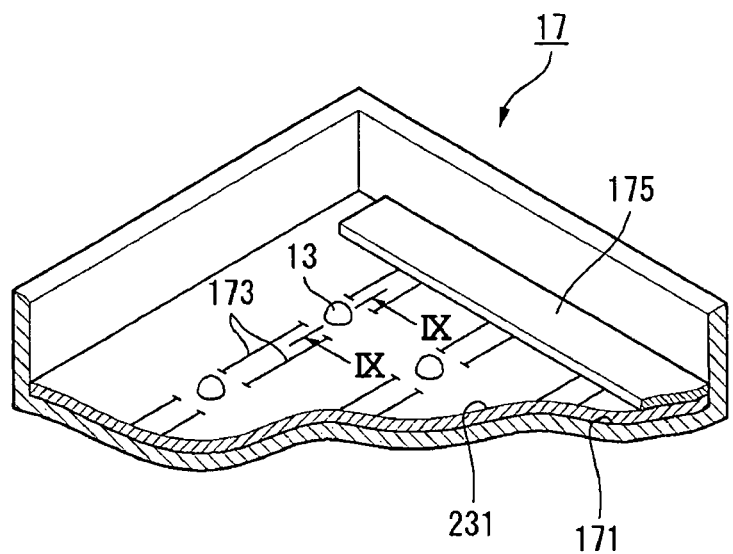
FIG. 8 is an enlarged diagram illustrating some portion of the FIG. 7.

FIG. 7 illustrates a backlight assembly according to the second embodiment of the present application. Especially, it shows how to mount the light emitting element 13 on the cover bottom 17. FIG. 8 is a partial enlarged view illustrating some portions of the FIG. 7. Comparing with FIG. 4, for the same elements, the same numerical references will be used and detailed explanation may not be mentioned. As shown in FIG. 7, the light emitting elements 13 are diposed in 3 row 6 column on the upper surface of the cover bottom 17.

As shown in FIGS. 7 and 8, overall the upper surface 171 of the cover bottom 17, an insulating layer 231 is formed. A plurality of light emitting element 13 are mounted on the insulating layer 231. All light emitting element 13 are electrically connected each other through a pattern 173 printed on the insulating layer 231. The pattern 173 is extended to the driving board 175 equipped at one side of the cover bottom 17. The driving board 175 is electrically connected to the pattern 173. Actually, the driving board 175 and the pattern 173 are connected through the connectors equipped at each side and the cable connecting them. In addition, the driving board 175 may include circuit elements and pattern circuit connecting the each element for generating signals driving the light emitting elements 13.

Figure 9:
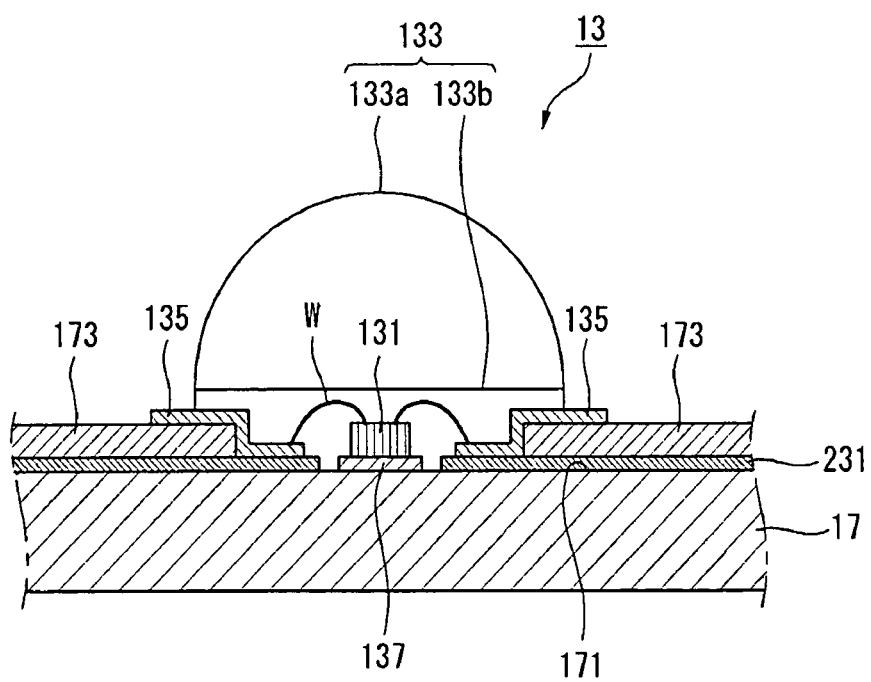
FIG. 9 is a cross-sectional diagram along the cutting line IX-IX of FIG. 8.

FIG. 9 is a cross-sectional view cutting along with the line IX-IX, illustrating the light emitting element 13 mounted on the cover bottom 17. In this embodiment, the light emitting element 13 includes an LED chip 131, a molding part 133, a lead part 135, and buffer 137.

As shown in FIG. 9, an insulating layer 231 is disposed on the cover bottom 17 in order to prevent the light emitting element 13 from being electrically shorted (in order to protect the light emitting element 13 from electric short). This insulating layer 231 is covering all bottom surfaces 171 of the cover bottom 17, but the insulating layer 231 may not be formed at the portion where the LED chip 131 is positioned.

The buffer 137 is formed where the insulating layer 231 is not formed. This buffer 137 may be made of tin or copper material so that it is possible to mount the LED diode easily thereon. The buffer 137 can suggest an interface between the cover bottom 17 and the LED chip 131 when the LED chip 131 is mounted thereon so that it is possible to mount the LED diode chip 131 on the cover bottom 17 safely. The LED chip 131 can be fixed on the buffer 137 using solder (not shown in the drawings).

In addition, on the insulating layer 231, a pattern part 173 made of the same material with the buffer 137 may be formed. This pattern part 173 and the buffer 137 may be formed in the same manufacturing process. For example, if the buffer is formed by a photo-lithograph method, the buffer 137 and the pattern part 173 can be formed by disposing a photo-resist on the insulating layer 231 and then patterning it.

The lead part 135 is formed from the end portion of the pattern part 173 to the insulating layer 231. The lead part 135 is electrically connected to the LED chip 131 by wire (w). Actually, the lead part 135 is mounted and fixed on the pattern part 173 using the solder (not shown). Due to this structure, the heat generated when the light emitting element 13 is working can be transmitted to the cover bottom 17 directly, so that it is possible for the emitting element 13 to be cooled down the heat quickly.

Figure 10:
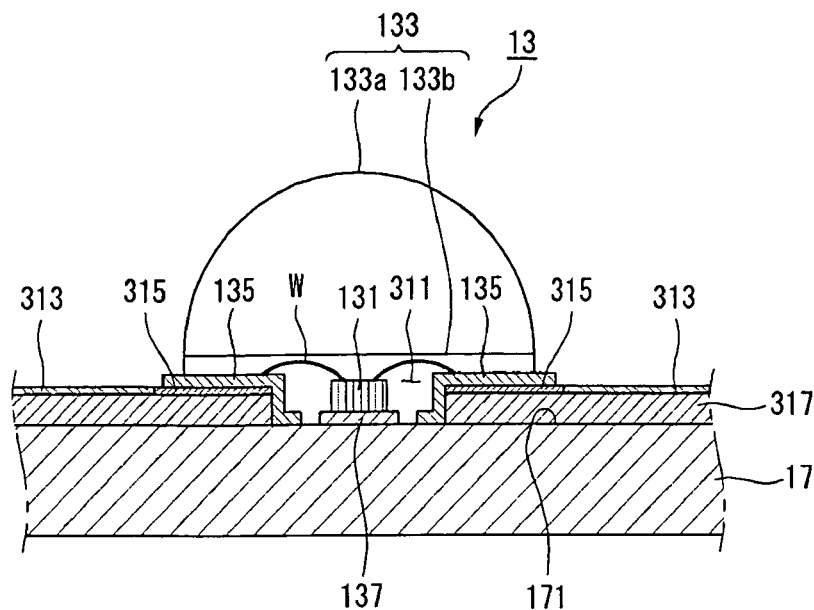
FIG. 10 is a cross-sectional diagram illustrating that the LEDs are connected by connecting modules.
Figure 11:
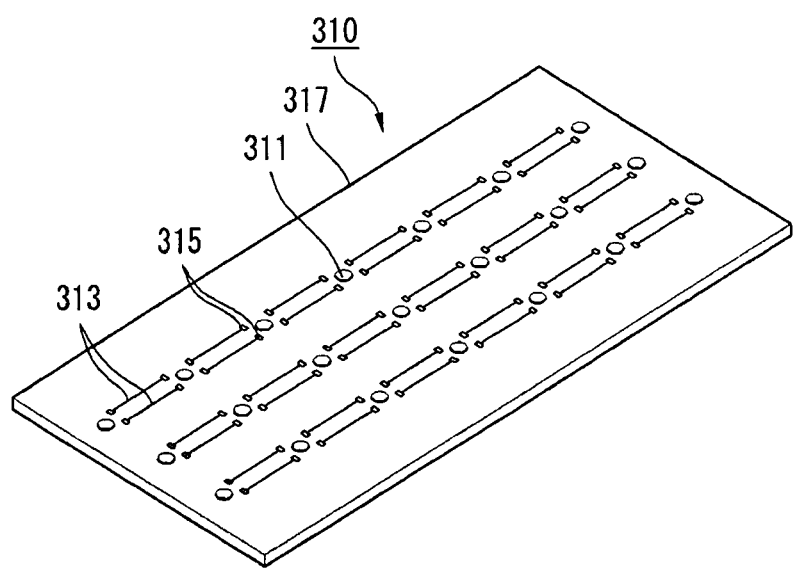
FIG. 11 illustrates the connecting module of FIG. 10.

As shown in FIG. 10, even though the light emitting element 13 can be directly mounted on the cover bottom 17, each light emitting element 13 can be connected by the connecting module 310 (shown in FIG. 11 comprising numerical references 311, 313, 315, and 317). FIG. 11 illustrates one example of the connecting module 310. The connecting module 310 may comprises a general purpose PCB such as FPC (Flexible Printed Circuit).

The connecting module 310 may include a substrate 317 and a plurality of LED chip hole 311 thereon. At near position of each LED chip hole 311, terminal 315 is disposed. Each terminal 315 can be electrically connected by the pattern part 313 printed on the substrate 317.

The connecting module 310 is assembled with the cover bottom 17 as the light emitting elements 13 are exposed through the LED chip holes 311 formed on the substrate 317. The lead part 135 formed at the light emitting element 13 contacts the terminal 315 disposed on the substrate 317 and the terminal 315 is fixed to the lead part 135 by solder (not shown).

In this embodiment, the LED chips are mounted at the bottom of the cover bottom. The LED chips are electrically connected each other by the pattern part of the thin film or thin plate. The driving board is mounted independently from the LED module. Therefore, when a reflective plate is assembled with the cover bottom, the reflective plate can be positioned just above the cover bottom without any interference with the driving board. As a result, it is possible to prevent the reflective plate from being bent so that it is possible to keep the light luminescence evenly over all surface of the reflective plate.

Furthermore, as the light emitting element 13 (especially LED chip 131) is directly mounted on the cover bottom 17, all portions of the cover bottom can be used for radiating the heat from the light emitting element 13. Therefore, the heat temperature of the backlight assembly can be lowered than conventional art. In addition, the junction temperature of the LED chip can be lowered so that it is possible to ensure the operating reliability of the LED chips.

Figure 12:
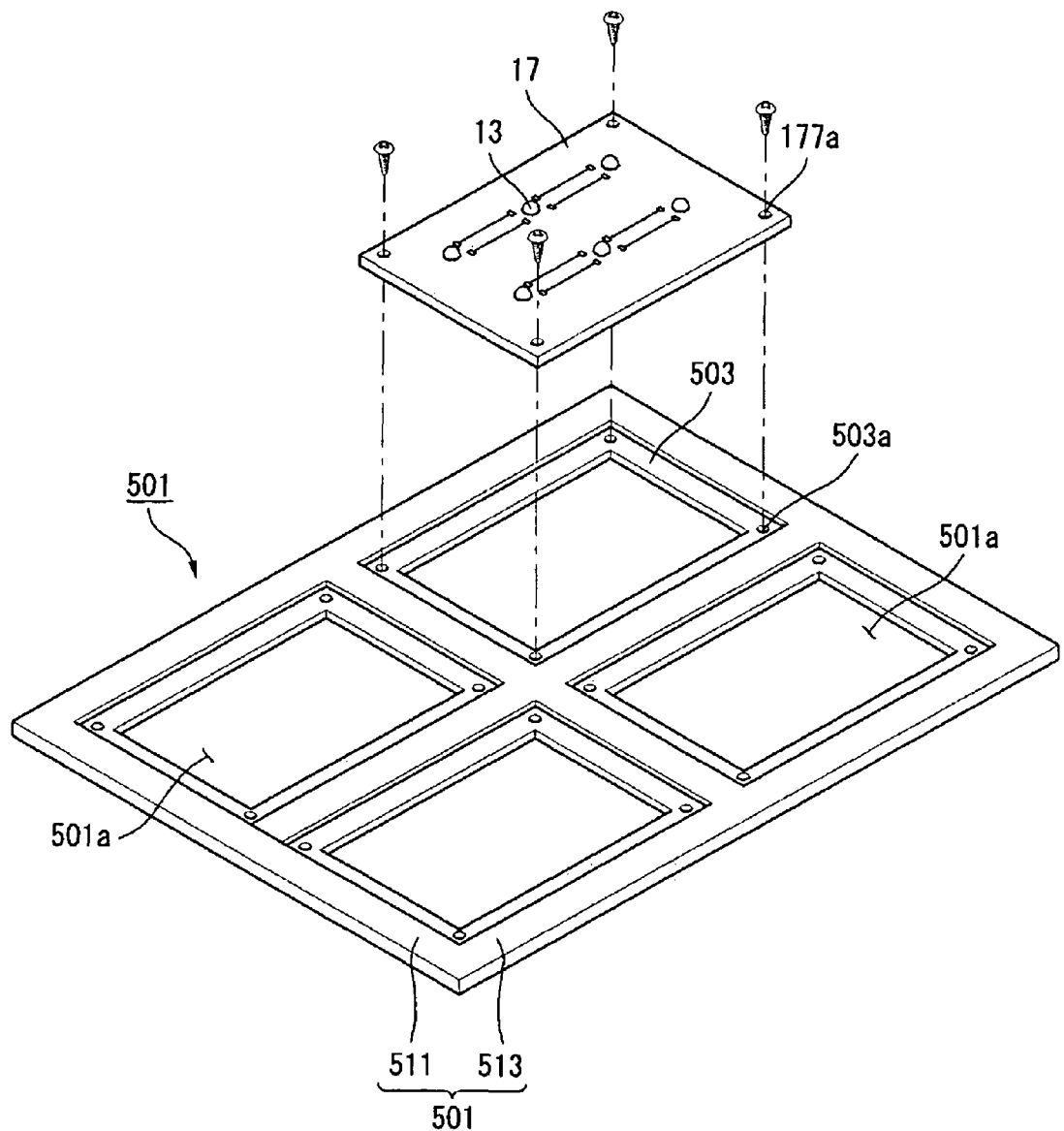
FIG. 12 is a diagram illustrating the frame on which divided cover bottoms having LED are mounted.

As mentioned above, in the embodiment that the light emitting element 13 is directly mounted on the cover bottom 17, for a large scale display panel, it is required to assemble a plurality of the cover bottom 17. In that case, a frame 501 is required for supporting a plurality of cover bottom 17. The frame 501 may safely support the structure of the assembled cover bottoms 17. FIG. 12 illustrates one example of the frame 501.

As shown in FIG. 12, the frame 501 may have a joining part 501a for mounting cover bottoms 17. The joining part 501a is formed by a lateral part 511 and longitudinal part 513 comprising the frame 501 having the same plane shape with the cover bottom 17. The lateral part 511 is disposed in lateral direction of the joining part 501a and the longitudinal part 513 is disposed in longitudinal direction of the joining part 501a. Therefore, the joining part 501a has a rectangular shape substantially and disposed in a matrix type on one plane.

Furthermore, recesses 503 may be formed at the joining part 501a. The recess 503 can eliminate a joining step difference between the frame 501 and the cover bottom 17 when the cover bottom 17 is assembled with the frame 501. Therefore, when the reflective plate is assembled thereto, the reflective plate can have even surface so that it is possible to keep the light luminescence evenly over all surface of the reflective plate.

The cover bottom 17 having the light emitting element 13 is positioned on the joining part 501a of the frame 501. At this time, it is preferable that the edge of the cover bottom is jointed with the recess 503 of the joining part 501a. As a result, the screw hole 177a formed at the cover bottom 17 and the screw hole 503a formed at the recess 503 can be disposed on the same line. As the cover bottom 17 is supported by the recess 503 and positioned inside of the joining part 501a, the frame 501 and the cover bottom 17 are disposed on the same plane. Aligning these two screw holes 177a and 503a, a screw is mounted through these screw holes 177a and 503a to fix the cover bottom 17 with the frame 501. The cover bottoms 17 mounted by each joining part 501 can be electrically connected each other by connecting the connector with cables (not shown).

According to one embodiment of the present application, the light emitting element is contacted with a metal plate disposed between substrate and the light emitting element so that the heat generated by the light emitting element can be quickly radiated through the metal plate. According to another embodiment of the present application, the light emitting element can directly contact to the cover bottom penetrating the substrate, so that the heat generated by the light emitting element can be quickly radiated through the cover bottom. According to still another embodiment of the present application, the light emitting element is directly mounted on the cover bottom, so that the heat generated by the light emitting element can be quickly radiated through the cover bottom. In the present application, as the cover bottom is used for radiating the heat generated by the light emitting element, the temperature of the backlight assembly can be effectively and quickly lowered than other related art. Therefore, the junction temperature of the LED chip can be lowered so that it is possible to ensure the operating reliability of the LED chips.

While the embodiment of the present invention has been described in detail with reference to the drawings, it will be understood by those skilled in the art that the invention features of the invention. Therefore, the scope of the invention is defined by the appended claims rather than the detailed description of the invention. All changes or modifications or their equivalents made within the meanings and scope of the claims should be construed as falling within the scope of the invention.

What is claimed is:

1. A backlight assembly comprising:

a cover bottom containing an optical film;

a substrate disposed on the cover bottom, and having a mounting hole to expose an upper surface of the cover bottom;

a light emitting element including a molding part mounted on the upper surface of the cover bottom exposed by the mounting hole;

a reflective plate having a hole corresponding to the light emitting element, and disposed between the cover bottom and the optical film; and a lead part disposed on a wall of the mounting hole and directly connected to each of the upper surface of the cover bottom and the substrate, wherein the light emitting element includes an LED chip disposed on the lead part, wherein the molding part includes a body portion and a lens portion, and wherein the molding part is directly connected to an upper surface of the lead part located on an upper surface of the substrate.

2. The backlight assembly according to the claim 1, further comprising:
   a heat radiating sheet disposed between the substrate and the cover bottom,
   wherein the heat radiating sheet directly contacts the lead part, a bottom surface of the substrate and the cover bottom.

3. The backlight assembly according to the claim 1, further comprising:
   a heat radiating plate disposed between the LED chip and the cover bottom.

* * * * *